United States Patent
Tounai

(10) Patent No.: US 6,519,759 B2
(45) Date of Patent: Feb. 11, 2003

(54) PHOTOMASK PATTERN SHAPE CORRECTION METHOD AND CORRECTED PHOTOMASK

(75) Inventor: Keiichiro Tounai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/837,957

(22) Filed: Apr. 19, 2001

(65) Prior Publication Data

US 2001/0034877 A1 Oct. 25, 2001

(30) Foreign Application Priority Data

Apr. 19, 2000 (JP) .................................... 2000-123702

(51) Int. Cl.[7] .............................................. G06F 17/50
(52) U.S. Cl. ............................................ 716/19; 716/21
(58) Field of Search ....................................... 716/19, 21

(56) References Cited

U.S. PATENT DOCUMENTS

| | | | |
|---|---|---|---|
| 5,350,704 A | * 9/1994 | Anderson et al. | 716/21 |
| 6,099,582 A | * 8/2000 | Haruki | 716/21 |
| 6,221,539 B1 | * 4/2001 | Kotani et al. | 716/21 |
| 6,335,981 B1 | * 1/2002 | Harazaki | 716/21 |
| 6,340,542 B1 | * 1/2002 | Inoue et al. | 716/21 |

* cited by examiner

Primary Examiner—Trong Phan
(74) Attorney, Agent, or Firm—Katten Muchin Zavis Rosenman

(57) ABSTRACT

To provide a photomask pattern shape correction method for suitably modifying and correcting a pattern deformation caused by a optical proximity effect. A corner 1 is extracted where an exterior angle of a wiring layer pattern is an angle of 90 degrees, which is out of a diffusion layer and where the distance R from the gate is within the predetermined value Rm and the interval between the gates is equal to or more than a set value Pm. A correction figure (A)11 is added to a side in the gate direction of this corner 1 and a correction figure (B)12 to the side not in the gate direction, and the interval G1 between the correction figure (B)12 and an adjacent correction figure is calculated, and the interval G1 calculated is checked whether it is equal to or more than the set value G1m. When the result of this checking satisfies "G1>G1m", a modification procedure is not performed and when the interval G1 is not equal to or more than the set value G1m, the correction figure (A)11 and the correction figure (B)12 are eliminated. In this way, no adverse effect of the part of the photoresist becoming tapered is produced in the gate portion and the sufficient optical proximity effect can be corrected.

20 Claims, 7 Drawing Sheets

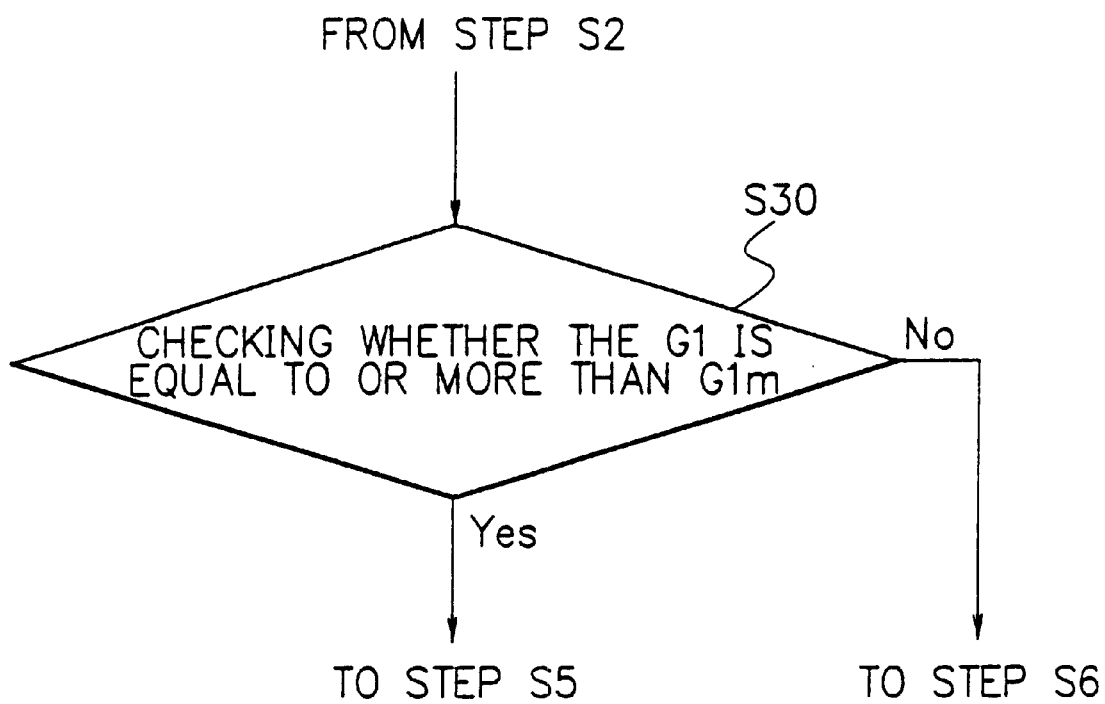

PHOTOMASK PATTERN SHAPE CORRECTION METHOD AND CORRECTED PHOTOMASK

BACKGROUND OF THE INVENTION

The present invention relates to a photomask pattern shape correction method to the photomask pattern shape correction method for modifying and correcting a pattern deformation, and a corrected photomask.

DESCRIPTION OF THE RELATED ART

Conventionally, a photomask pattern shape correction method is, for example, applied to modification and correction of a pattern deformation which is caused in a pattern formed with photolithography (photo etching) by the optical proximity effect of the optical system at the time of its formation.

The conventional photomask pattern shape correction method is shown in FIG. 1. When a wiring layer of an angle 3 is to be corrected, a correction figure (A)31, a correction figure (B)32 are added for correction by putting a notch 33 on the corner 3. The size of the correction figure (A)31 and the correction figure (B)32 is set to the same dimensions of a size a3 and a size b3. Moreover, a gate width W, and an interval G1 and an interval G2 between the correction figures are not taken into consideration when the correction figures are added.

SUMMARY OF THE INVENTION

However, the photomask formation of the above described conventional correction figure is accompanied by a problem that the shape of a photoresist is not correctly formed under a predetermined condition by means of optical proximity effect.

Against the above described problem thus arisen, an addition of a suitable correction figure is required. As an example, a photoresist shape example is shown in FIG. 2. In the correction method applied in the FIG. 2, a large size of the correction figure maximizes the effect of reducing a roundness of the corner 3 of a wire resist pattern 55 of FIG. 2 in the photoresist attributable to the optical proximity effect. As a result, taper 51 is produced which make a part of the gate portion to taper, causing adverse effects. When the correction figure is made small so as not to cause any adverse effect, there arises the problem that the roundness of the wire resist pattern 55 in the photoresist at the corner portion is not sufficiently made small and the correction of the optical proximity effect is not sufficiently obtained.

Moreover, when the wiring width is small and the interval between the correction figures is narrow, the taper 52 of the photoresist becomes large, thereby raising a new problem that a risk of disconnecting the wire is committed. FIG. 2 shows that one side (edge) of the wiring width narrowing is considered only. However, in general the narrowing of the wiring width is caused in both sides of wiring layer, thereby the wiring layer width is much narrower.

It is the object of the present invention to provide the photomask pattern shape correction method for suitably modifying and correcting the pattern deformation (narrowing, rounding or the like) caused by the optical proximity effect.

In order to achieve such an object, the photomask pattern shape correction method of the invention is characterized in that, in the photomask pattern shape correction method of the wiring layer wherein correcting a photomask pattern on corner portions of a wiring layer by a optical proximity effect, said corner portions corresponding to exterior angles of said wiring layer except for any angle of approximate 180°, wherein a first correction figure is applied when a distance between said corner portion and a gate electrode is within a predetermined range of distance; and a second correction figure is applied when the distance between said corner portion and said gate electrode is over the predetermined range of distance.

Moreover, the size of the correction figure which determines whether a correction figure is to be added depending on the width of the above described pattern gate, the interval between the gates, the interval between the correction figures and the size of the wiring pattern width may take the size of the correction figure for an edge in the same direction as the gate direction and the size of the correction figure for the edge in the different direction from the gate direction as mutually different size, and the size of the correction figure for the edge in the same direction as the gate direction may be made smaller than the size of the correction figure for the edge in the different direction from the gate direction, or only the correction figure of the different direction from the gate direction may be formed and the correction figure for the edge of the same direction as the gate direction may be not formed.

The photomask pattern shape correction method of the invention according to claim 6 is characterized in that it comprises a step (S1) of extracting an corner (1) where the exterior angle of the wiring layer pattern is an angle of 90 degrees, which is out of the diffusion layer and where the distance from the gate is within a predetermined value (Rm) and the interval between the gates is equal to or more than the predetermined value (Pm), a step (S2) of adding a predetermined correction figure A to the edge in the gate direction of the extracted corner (1) and the correction figure B to the edge not in the gate direction respectively, a step (S3) of calculating the interval G1 between the correction figure B and an adjacent correction figure, a step (S4) of checking whether the interval G1 calculated at the step (S3) is equal to or more than the predetermined value (G1m) and a step (S6) of eliminating the correction figure A and the correction figure B when the result of the checking does not satisfy "G1>G1m", thereby the formation of the correction figure A and the correction figure B is performed.

BRIEF DESCRIPTION OF THE DRAWINGS

The objects and features of the present invention will become more apparent from the consideration of the following detailed description taken in conjunction with the accompanying drawings, in which:

FIG. 3b is a flow chart showing a step S30 in place of both steps S3 and S4 shown by FIG. 3a;

FIG. 4b is a flow chart showing a step S30 in place of both steps S3 and S4 shown by FIG. 4a;

DESCRIPTION OF THE PREFERRED EMBODIMENTS

Next, embodiments of the photomask pattern shape correction method according to the present invention will be described with reference to the drawings attached hereto. By referring to FIG. 3A through FIG. 7, one embodiment of the photomask pattern shape correction method of the present invention is shown. In the specification, a wiring layer will be explained as the layer applying a gate to voltage (current), for example. The correction method according to the present invention relates to cover the whole range of photmask pattern correction by optical proximity effect. In particular, the method according to the present invention for applying to make wiring layer patterns is preferred.

Figure 7:
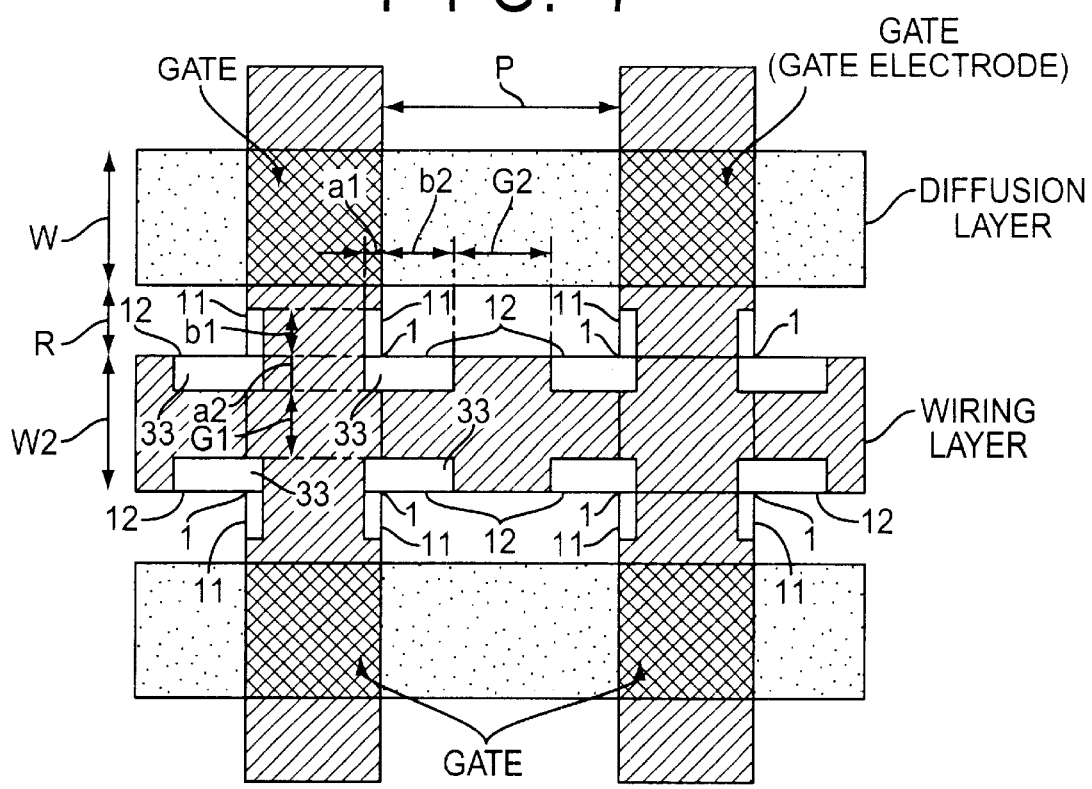
FIG. 7 is a pattern layout showing a configuration example of the correction figure.

FIGS. 3 to 4 are flow chart showing the processing procedure of the embodiments of the photomask pattern shape correction method of the present invention. FIG. 7 is a layout pattern drawing showing a configuration example of correction figures. In this embodiment, on the basis of planning data, a layout pattern shown by FIG. 5 is made. The layout pattern in FIG. 5 is an ideal pattern. In order to make a mask pattern to be formed, a following process will be set forth in bellow shown by FIGS. 3 to 4.

Figure 3A:
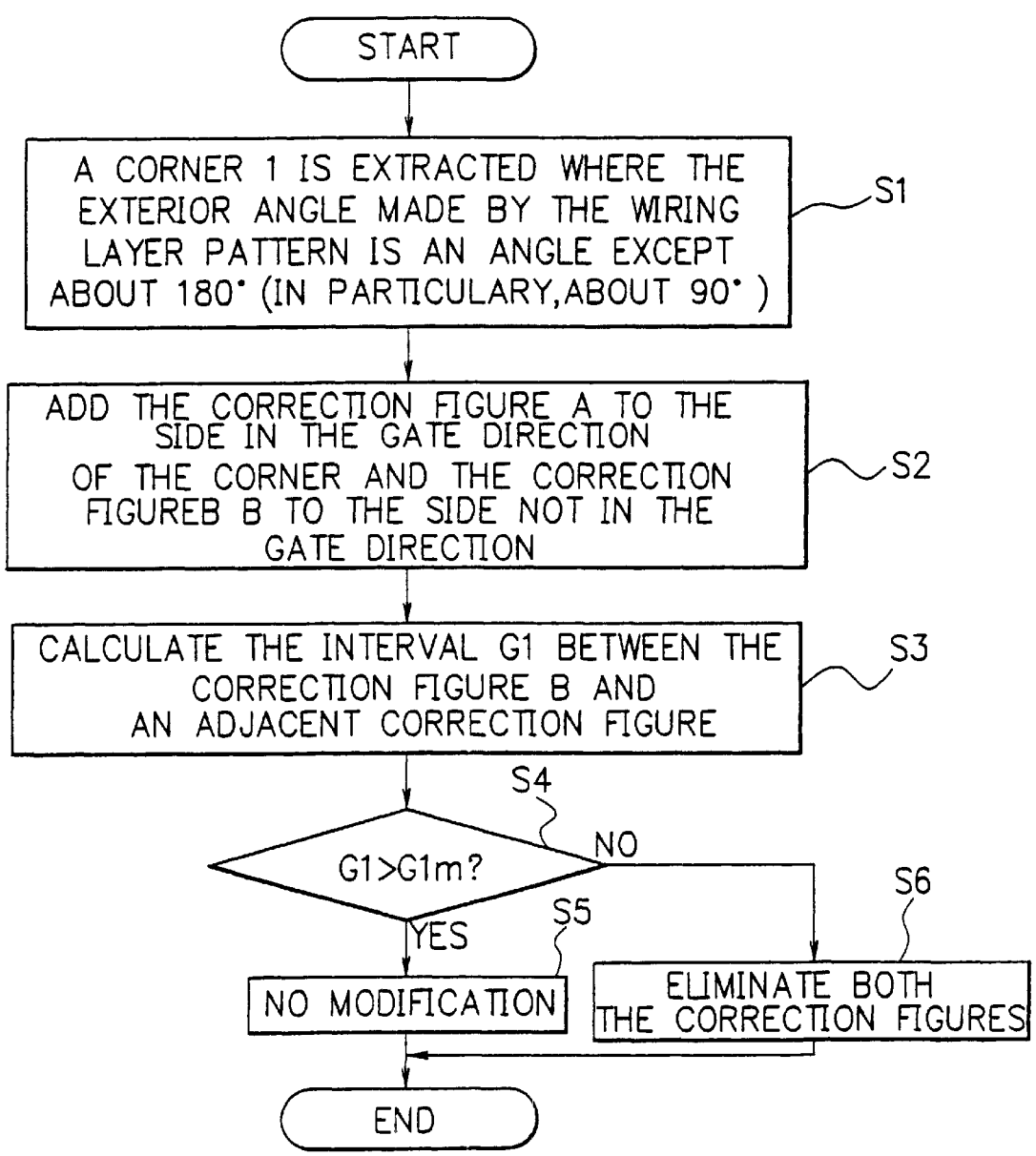
FIG. 3a is a flow chart showing the processing procedure of an embodiment of the photoresist pattern shape correction method of the present invention.
Figure 4A:
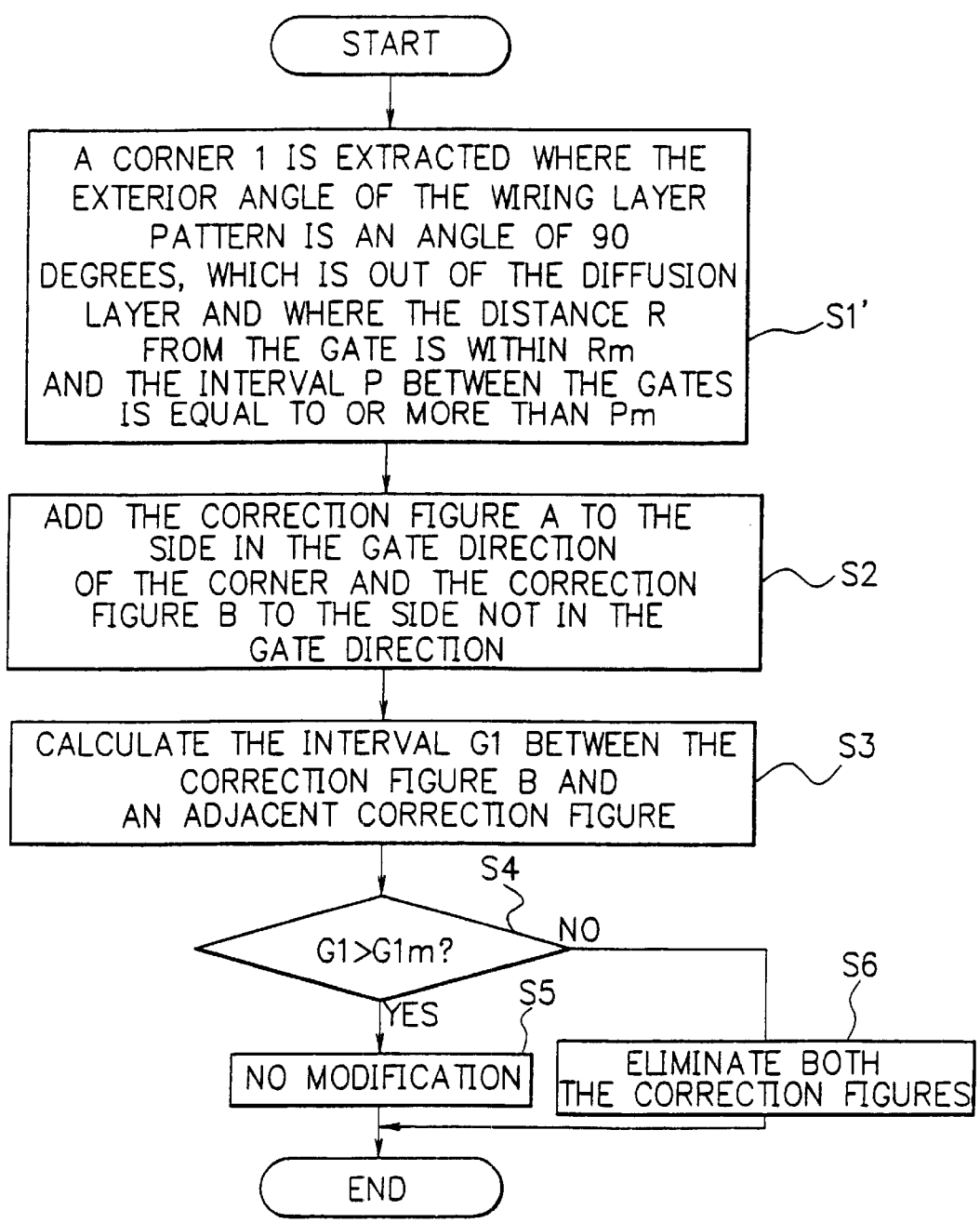
FIG. 4a is a flow chart showing the processing procedure of an another embodiment of the photoresist pattern shape correction method of the present invention.
Figure 4B:
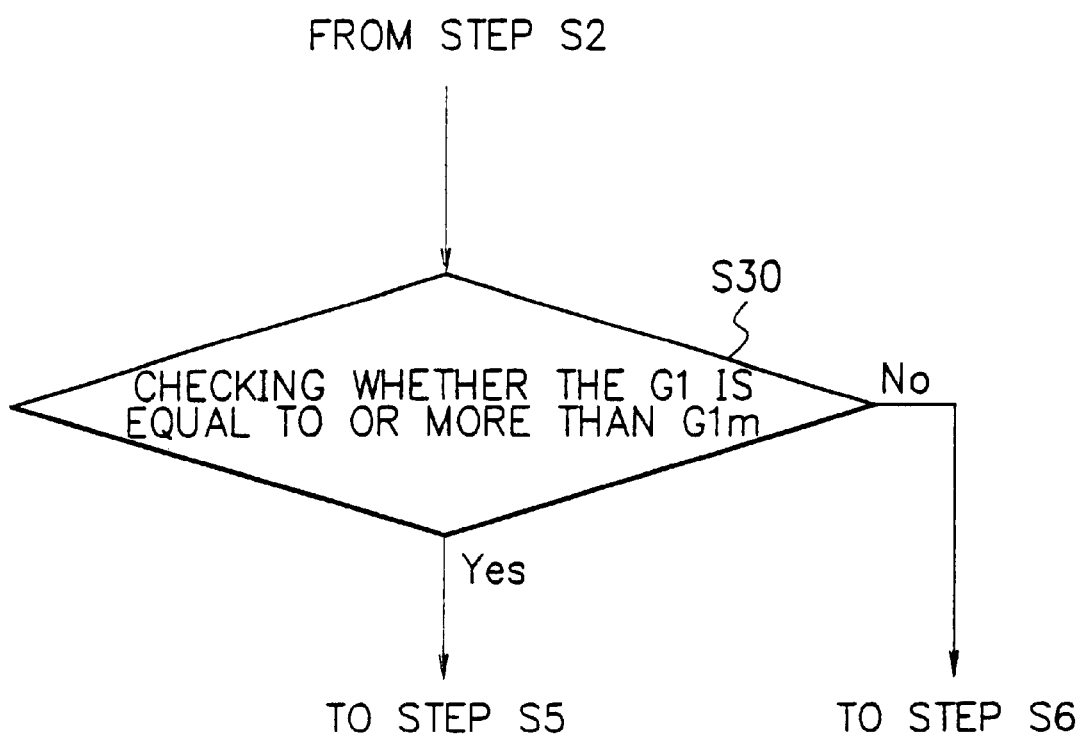
Figure 5:
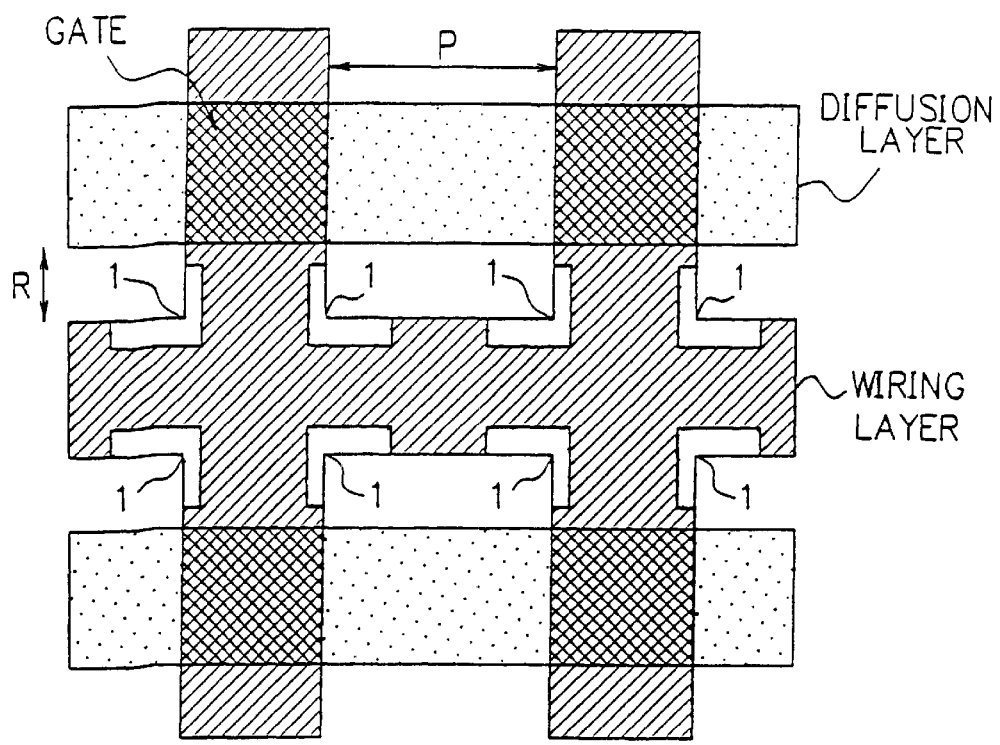
FIG. 5 is a drawing showing an example of ideal photoresist pattern shape.
Figure 6:
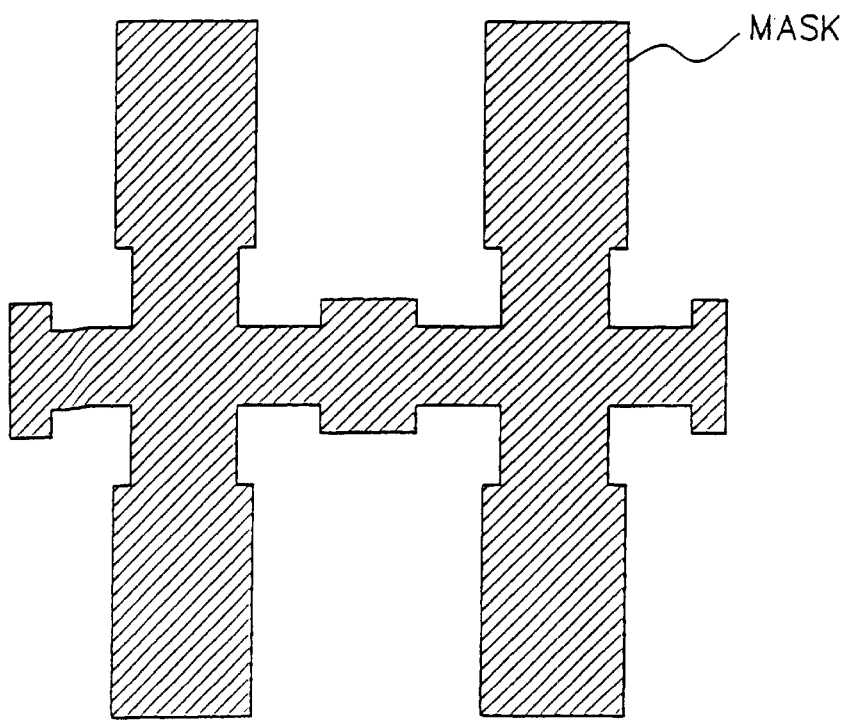
FIG. 6 is a drawing showing an example of corrected photomask.
Figure 8:
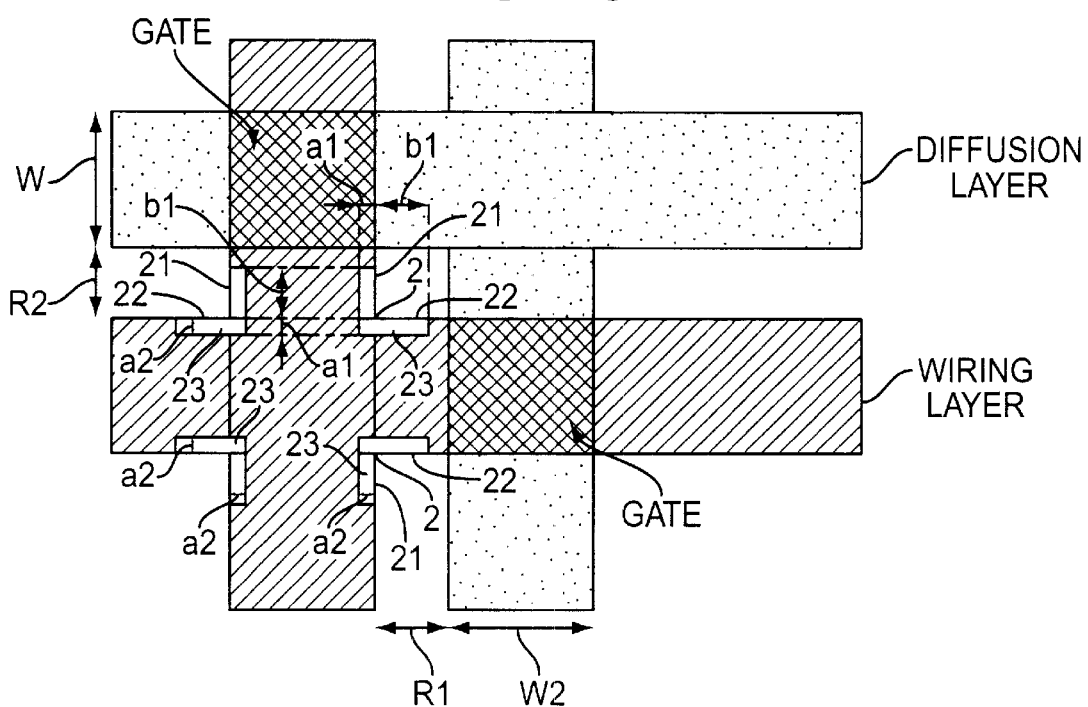
FIG. 8 is a pattern layout showing a configuration example of the correction figure of a second embodiment.

As shown by flowcharts in FIGS. 3A, 3B, 4A and 4B, in an example of a processing procedure, a photmask pattern correction is made at an extracted exterior angle of the wiring layer. In generally, a pattern edge of wiring layer becomes ruggedness in fine pitch. However, an edge of the wiring layer can approximated by a straight line. As shown by FIGS. 5, 7 or 8, the exterior angles are almost classified about 90 or 270°. A process shown in FIGS. 3A and 3B, is preferably extracted exterior angle of about 90°. The present invention is selected from one or more items, wherein item is out of diffusion layer (item 1), the distance R from the gate is within Rm (item 2) and interval P between the gates is equal to or more than Pm (item 3)(not shown). FIGS. 4A and 4B show that the items 1 to 3 are necessarily conditions. That is, in the processing procedure examples in FIGS. 4A and 4B, an angle 1 is extracted where an exterior angle of the wiring layer pattern is an angle of 90 degrees, which is out of the diffusion layer and where the distance R from the gate is within the predetermined value Rm and the interval between the gates is equal to or more than the set value Pm (the step S1). Moreover, the correction figure (A)11 is added to the edge in the gate direction of the corner 1 and the correction figure (B)12 to the edge not in the gate direction (the step S2), and the interval G1 between the correction figure (B)12 and an adjacent correction figure is calculated (the step S3) and the interval G1 calculated in the step S3 is checked whether it is equal to or more than the set value G1m in the step S4. When the result of the checking (S4) satisfies "G1>G1m", a modification procedure is not performed (a step S5) and when the interval G1 is not equal to or more than the set value G1m (S4/NO), the correction figure (A)11 and the correction figure (B)12 are eliminated (the step S6). In particular, the present invention the step S3 and S4 may be replaced by the step S30, as shown in FIGS. 3B and 4B. The step S30 is performing step of checking whether the interval G1 between the correction figure B and an adjacent correction figure is equal to or more than predetermined G1m.

Operation Example

FIG. 5 shows an example of chip is set up an activation area (a diffusion layer) in horizontal direction. The activation area is formed on a semiconductor substrate surrounded by an element dividing area. Wiring layer is formed between the activation layer so as to be prolonging in a horizontal direction. A material of the wiring layer is not restricted, however is formed for example, by polycrystalline silicon. A crossing area (superposition area) with wiring layer pattern and diffusion layer pattern is a gate area which has a function of a transistor gate. An area exception of the gate area is wiring area.

Wiring layer is formed a mono layer in general, however wiring layer(s) may be formed multi-layer.

The activation area which is an under layer of the gate layer is a channel area in general. The activating layer in both sides of the gate layer becomes a source drain area.

FIG. 5 shows an ideal layout pattern that in layout pattern process step shown by FIG. 3 or FIG. 4 applying to a mask pattern at an adequate ratio size. The circuit layout shown by FIG. 5 shows a part of a pattern example used CMOS logic, for example.

The pattern layout is shown in FIG. 7. This pattern layout includes the patterns of a diffusion layer (an activation area) and a wiring layer. The part where the wiring layer pattern is lapped over the diffusion layer pattern becomes a transistor gate. When the corner of the wiring layer pattern is out of the diffusion layer pattern and the distance R from the gate is smaller than the set value Rm, the correction figure (A)11 and the correction figure (B)12 for correction are added by putting a notch 33 on the corner 1 of the wiring layer pattern. Connecting parts at the corner 1 of both correction figures are joined so as to fill up a gap. When the gate width W is larger than the set value Wm, the interval P between the gates is smaller than the set value Pm or the interval G1 between the adjacent correction figures (B) is smaller than the set value G1m, the correction figure (A)11 and the correction figure (B)12 are not added.

The above-mentioned set value Rm may be used a convenient value adding about 0.5 to 1 time of exposure light wavelength and a overlay tolerance value. In another case, a layout pattern is used so that correction FIGS. 31, 32 shown by FIG. 8 in a conventional example are not contained. In the pattern, R1 from the corner 3 is defined by experiment or simulation. That is, by a rounded corner portion 55 of the pattern, range R1 wherein gate size is out of tolerance, is defined.

By adding the R1 to a process variable error and an overlay tolerance value, obtained value may be Rm. This precise Rm value may be replaced to an enlarged Rm value. When the enlarged Rm value is used, by increasing correcting patterns, it takes much time. However, by using the enlarged Rm value, margin increases for the process variable error and the overlay tolerance value.

The set value Pm is obtained by experiment or simulation. When a distance P is enough a large pattern, e.g. for about ten times of a minimum gate size an optimum correction figures 11, 12 are obtained. In a case of a distance P is little pattern, when the correcting figures 11,12 is added, a value wherein a distance of wiring layer (a distance P which wiring layer is formed between a corner 1 and the next corner minus two times of a length b2) is lower limit of P in allowance value is set Pm. Replacing Pm value to G2 value may be used.

G1 value is obtained by deducing two times of width a2 from W2. A value of the correction figure width in a maximum value of allowance in the G1 value may be set G1m.

With regard to the size of the correction figures, the size a1, b1 of the correction figure (A)11 for the edge in the gate direction and the size a2, b2 of the correction figure (B)12 for the edge not in the gate direction are made different, and the correction figure (A)11 is made smaller than the correction figure (B)12.

Effect of the Invention

In the first place, the adverse effect of a part of the photoresist becoming tapered is not produced in the gate portion and the effect of correcting sufficient optical proximity effect is obtained.

A large size of the correction figure maximizes the effect of reducing the roundness of the corner of the photoresist attributable to the optical proximity effect. As a result, the adverse effect of the part of the gate becoming tapered is produced. The correction figure (A)11 and the correction figure (B)12 have the same effect of the optical proximity effect correction. On the other hand, the phenomenon of the part of the gate becoming tapered has a larger influence on the correction figure (A)11 than on the correction figure (B)12. By allowing the correction figure (A)11 to become smaller and the correction figure (B)12 to become larger, the adverse effect of the part of the gate becoming tapered is controlled so that the effect of the optical proximity effect correction can be enhanced.

In the second place, an unnecessary part is not corrected by the correction and therefore the increase in the size of the pattern data is reduced.

In case of large gate width, roundness of the corners has little effect on the device, so that the correction is not required. Thus, addition of the correction figures is eliminated, thereby avoiding increase of the number of figures and therefore increase of the data size.

Figure 1:
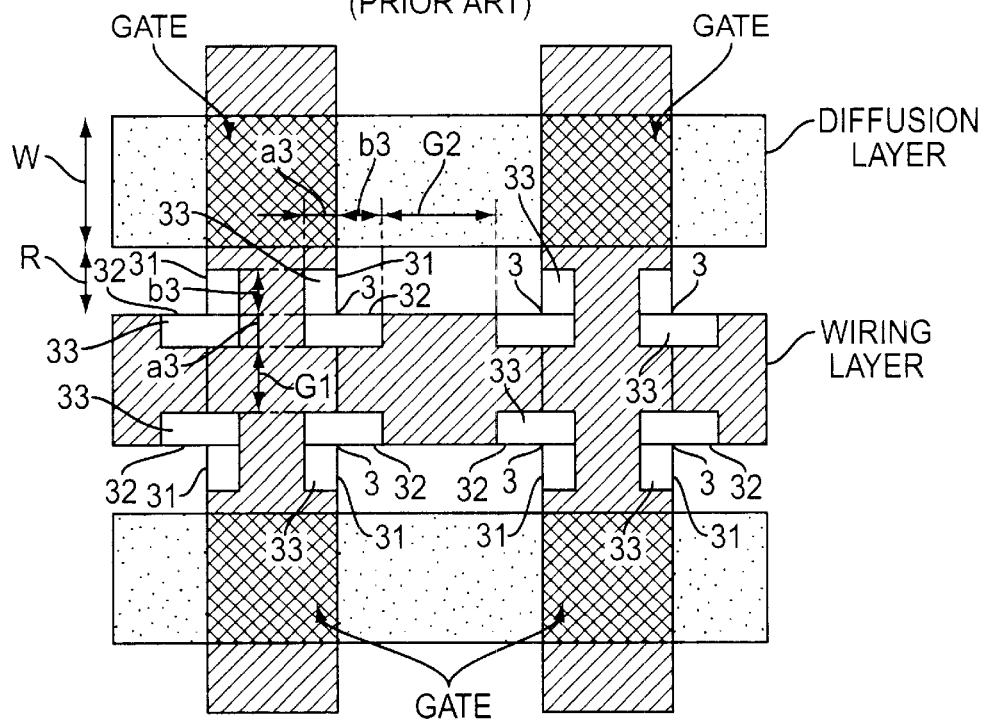
FIG. 1 is a drawing showing an example of the conventional photoresist pattern shape correction method.

In the third place, in conventional method shown by FIG. 1, by extracting all the corner, correction of optical proximity effect is merely performed. Thereby, extracted corner has been corrected without classified about where the corner is located. In the present invention, the corner extracts by condition shown by FIGS. 3 to 4, classifies suitably and selects a size of adding correction figure so that performs correction of optical proximity effect. In the present invention, unsuitable corner by extracting condition(s) may be performed correction of optical proximity effect. Correction process is not merely complicated.

As described above, in the case where the interval between the correction figures is narrow according to the present invention, the disconnection of the wiring is prevented.

When the interval between the correction figures is narrow, the wiring portion tends to be easily disconnected according to the present invention. In such a case, by performing no correction, the disconnection of the wiring can be prevented. The corner 1, 2, 3 are classified, on the basis of locating from the narrowest gate electrode. For example, the corner is located when inner of predetermined distance only one gate electrode is refer to "1", when two gate electrodes are refer to "2" and the remaining is refer to "3" (in the case of only a conventional correction or the like is performed). The corner means an element which is forming an exterior angle, for example, a point, an area or an edge. In the specification, the corner contains any one of the above meanings.

OTHER EMBODIMENTS

The second embodiment is shown in FIG. 8. The edge adjacent to a corner 2 is the edge where whichever edge is the edge in the gate direction. The corner 2 has the distances R1 and R2 equal to or less than Rm from the gate at both edges. In this case, the size of "a1, b1" of the correction figures is adapted to whichever edge is in the gate direction.

Figure 2:
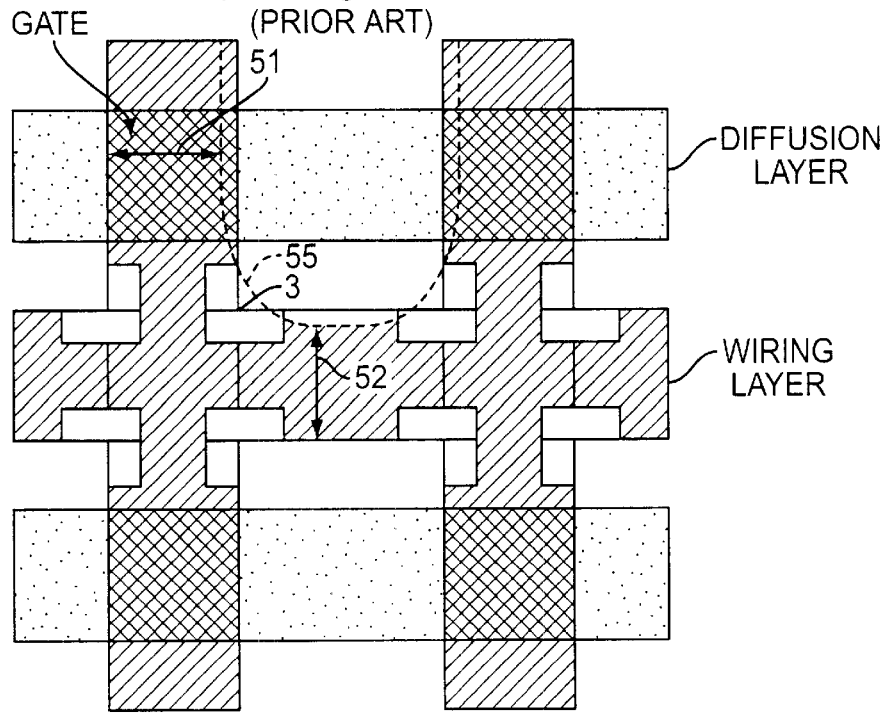
FIG. 2 is a drawing showing an example of the conventional photoresist pattern shape.

Moreover, as a modified embodiment; in place of the limit of the interval P between the gates as shown in FIG. 2, the smallest possible interval limit of the interval G2 between the correction figures (B)12 may be adapted. Alternatively, the smallest possible width limit of the wiring pattern width W2 may be added. Moreover, the correction figure (A)11 may not be added, but only the correction figure (B)12 may be added. In the embodiment, mask pattern is not shown. However, it is apparent from comparing FIGS. 6 and 7, in FIG. 8, added part (white-on-oblique) of the correction figure is a cut off part of mask pattern. As a result, oblique lined part in FIG. 8 is corrected photo mask pattern.

Although the above described embodiments are one example of the preferred embodiments, it should be understood that it is not limited thereto but that a variety of modified examples are possible without departing from the spirit and scope of the present invention. In particular, the present embodiment the step S3 and S4 are replaced by the step S30. The step S30 is performing step of checking whether the interval G1 between the correction figure B and an adjacent correction figure is more than predetermined G1m as shown by FIG. 3b or 4b.

As is apparent from the above description, the photomask pattern shape correction method of the invention according to claim 1 searches the pattern forming portion which has the angel of the wiring layer pattern outedge of the diffusion layer and is within a predetermined range of the distance from the gate, adds a predetermined correction figure by putting a notch on the angle of the formed pattern and corrects the shape of the corner portion of the pattern forming portion. In this way, no adverse effect of the part of the photoresist becoming tapered is caused in the gate portion and the sufficient optical proximity effect can be corrected.

What is claimed is:

1. A photomask pattern shape correction method for correcting a photomask pattern on corner portions of a wiring layer by a optical proximity effect, said method comprising steps of:

searching said corner portions corresponding to exterior angles of said wiring layer except for any angle of approximate 180°;

applying a first correction figure when a distance between said corner portion and a gate electrode is within a predetermined range of distance; and applying a second correction figure when the distance between said corner portion and said gate electrode is over the predetermined range of distance.

2. A photomask pattern shape correction method for correcting a photomask pattern of a wiring layer in which a portion overlapping a diffusion layer forms a gate electrode, wherein;

a corner portion of a pattern of said wiring layer is in a vicinity of a vertex of an exterior angle formed by the gate electrode; said method comprising steps of;

determining said corner portion as apart from the gate electrode by a distance within a predetermined range, and adding a designated correction figure by applying a notch from the vicinity of a center of said corner portion.

3. The photomask pattern shape correction method according to claim 2, wherein said correction figures take different sizes for a first edge in a same direction as the direction in which the gate electrode can move within the wiring layer, and for a second edge in a direction different from said direction in which the gate electrode can move within the wiring layer.

4. The photomask pattern shape correction method according to claim 2, wherein said correction figures take different sizes for a first edge in a same direction as the direction in which the gate electrode can move within the wiring layer, and for a second edge in a direction different from said direction in which the gate electrode can move within the wiring layer; and the size of the correction figure for the first edge in the same direction as the direction in which the gate electrode can move within the wiring layer is made smaller than the size of the correction figure for the second edge.

5. The photomask pattern shape correction method according to claim 2, further comprising steps of;

forming only a correction figure for the second edge in the different direction from said direction in which the gate electrode can move within the wiring layer, and not forming a correction figure for the first edge in the same direction as said direction in which the gate electrode can move within the wiring layer.

6. A photomask pattern shape correction method for correcting a photomask pattern on corner portions of a wiring layer by a optical proximity effect, said method comprising steps of;

searching said corner portions corresponding to exterior angles of said wiring layer except for any angle of approximate 180°;

applying a first correction figure when a distance between said corner portion and a gate electrode is within a predetermined range of distance;

applying a second correction figure when the distance between said corner portion and said gate electrode is over the predetermined range of distance; and determining whether said first and second correction figures are to be added depending on a gate width of said pattern, an interval between the gates, an interval between correction figures, and a width of the wiring pattern.

7. The photomask pattern shape correction method according to claim 6, wherein said first and second correction figures take different sizes between a edge in a same direction as the direction in which the gate electrode can move within the wiring layer, and another side in a direction different from said direction in which the gate electrode can move within the wiring layer.

8. The photomask pattern shape correction method according to claim 6, further comprising steps of;

forming only a correction figure for the edge in the different direction in which the gate electrode can move within the wiring layer, and not forming a correction figure for the edge in the same direction as said direction in which the gate electrode can move within the wiring layer.

9. A photomask pattern shape correction method for correcting a photomask pattern of a wiring layer in which a portion overlapping a diffusion layer forms a gate electrode, comprising steps of;

a corner portion of a pattern of said wiring layer is in a vicinity of a vertex of an exterior angle formed by the diffusion layer; and said method comprising steps of:

determining said corner portion as apart from the gate electrode by a distance within a predetermined range;

adding a designated correction figure by applying a notch from the vicinity of a center of said corner portion; and determining whether said correction figure is to be added depending on a gate width of said pattern, an interval between the gates, an interval between correction figures, and a width of the wiring pattern.

10. The photomask pattern shape correction method according to claim 9, wherein said correction figures take different sizes between a first edge in a same direction as the direction in which the gate electrode can move within the wiring layer, and a second edge in a direction different from said direction in which the gate electrode can move within the wiring layer.

11. The photomask pattern shape correction method according to claim 9, wherein said correction figures take different sizes between a first edge in a same direction as the direction in which the gate electrode can move within the wiring layer, and a second edge in a direction different from said direction in which the gate electrode can move within the wiring layer; and the size of the correction figure for the first edge in the same direction as the direction in which the gate electrode can move within the wiring layer is made smaller than the size of the correction figure for the second edge in the different direction from said direction.

12. The photomask pattern shape correction method according to claim 9, further comprising steps of;

forming only a correction figure for a first edge in the different direction from said direction in which the gate electrode can move within the wiring layer, and not forming while the correction figure for a second edge in the same direction as said direction in which the gate electrode can move within the wiring layer.

13. A photomask pattern shape correction method, comprising the steps of:

extracting a corner portion on a basis of at least one among three conditions including, the corner portion of a pattern of a wiring layer where exterior angles except for any angle of approximate 180° is formed exist outside a diffusion layer, the corner portion is apart from a gate electrode by a distance within a predetermined value (Rm), and an interval between gate electrodes is equal to or more than a predetermined value (Pm);

adding a predetermined correction figure A to a first edge in a direction in which the gate electrode with respect to said corner portion being extracted can move within the wiring layer, and a correction figure B to a second edge in a different direction;

calculating an interval G1 between the correction figure B and an adjacent correction figure;

determining whether the interval G1 obtained at said calculating step is equal to or more than a predetermined value (G1m); and eliminating the correction figure A and the correction figure B when G1m is not greater than G1.

14. A photomask pattern shape correction method, comprising steps of:

extracting a corner portion on a basis of at least one among three conditions including, the corner portion of a pattern of a wiring layer where exterior angles except for any angle of approximate 180° is formed exist outside a diffusion layer, the corner portion is apart from a gate electrode by a distance within a predetermined value (Rm), and an interval between gate electrodes is equal to or more than a predetermined value (Pm);

adding a predetermined correction figure A to an edge in a direction in which the gate electrode with respect to said corner portion being extracted can move within the wiring layer, and a correction figure B to another edge in a different direction;

checking whether the interval G1 between the correction figure B and an adjacent correction figure is equal to or more than a predetermined value (G1m); and eliminating the correction figure A and the correction figure B when G1m is less than G1.

15. A corrected photo mask wherein the photo mask is manufactured by using claim 1.

16. A corrected photo mask wherein the photo mask is manufactured by using claim 2.

17. A corrected photo mask wherein the photo mask is manufactured by using claim 6.

18. A corrected photo mask wherein the photo mask is manufactured by using claim 9.

19. A corrected photo mask wherein the photo mask is manufactured by using claim 13.

20. A corrected photo mask wherein the photo mask is manufactured by using claim 14.

* * * * *